United States Patent [19]

Parks

[11] 4,277,740

[45] Jul. 7, 1981

[54] CABLE TESTER FOR MULTIPAIR CABLES

[75] Inventor: Kenneth B. Parks, Lilburn, Ga.

[73] Assignee: Bell Telephone Laboratories, Incorporated, Murray Hill, N.J.

[21] Appl. No.: 87,433

[22] Filed: Oct. 22, 1979

[51] Int. Cl.³ .......................................... G01R 31/02
[52] U.S. Cl. .............................. 324/51; 179/175.3 A; 324/66
[58] Field of Search ............... 324/51, 52, 66, 73 R; 179/175.3 A, 175.3 F

[56] References Cited

U.S. PATENT DOCUMENTS

| | | | |
|---|---|---|---|
| 3,054,949 | 9/1962 | Bates et al. | 324/66 |
| 3,986,106 | 10/1976 | Shuck et al. | 324/66 X |
| 4,015,200 | 3/1977 | Strandh | 324/51 |
| 4,074,187 | 2/1978 | Miller et al. | 324/66 X |

FOREIGN PATENT DOCUMENTS

| | | | |
|---|---|---|---|
| 193003 | 11/1957 | Austria | 324/66 |
| 559908 | 7/1958 | Canada | 324/66 |
| 2206963 | 8/1973 | Fed. Rep. of Germany | 324/66 |
| 2744691 | 9/1978 | Fed. Rep. of Germany | 324/51 |
| 977813 | 4/1951 | France | 324/66 |
| 127333 | 9/1958 | U.S.S.R. | 324/52 |

Primary Examiner—Gerard R. Strecker
Attorney, Agent, or Firm—Robert O. Nimtz

[57] ABSTRACT

Multipair cable testing apparatus for detecting transpositions and reversals in the cable pairs includes master unit (100) located at one end of the cable and remote unit (200) located at the other end.

Master unit (100) comprises: pair address generator (120) for automatically and sequentially stepping through a grouping of pairs simultaneously terminated by master unit (100); sequencer (110) to sequentially connect, during each testing step, a pair under test to voltage measurement means (150) and then to resistance measurement means (160); indicator means (170) to display the results of the two measurements; and communicating means (175) to transmit the terminal address of the pair under test to remote unit (200).

Remote unit (200) comprises: decoder means (210) for receiving the address information of the pair under test; means (220) for terminating the grouping of pairs at predetermined addresses and placing a voltage on all pairs located at the predetermined address except for the pair having the preselected address; and polarity-sensitive resistance means (226,227) connected across each pair and oriented to provide low resistance for a reversal.

Indicator means (170) signals a transposition whenever voltage means (150) measures a voltage greater than a predetermined threshold and signals a reversal whenever resistance means (160) measures a resistance less than a predetermined level.

Cross-connect apparatus (300) effects detection of transpositions between different pair groupings, and extends automated testing capability to any number of groups.

9 Claims, 6 Drawing Figures

FIG. 5

CABLE TESTER FOR MULTIPAIR CABLES

BACKGROUND OF THE INVENTION

1. Field of the Invention

This invention relates generally to detecting faults in multipair cables and, more particularly, to a method and apparatus for indicating which pairs in the cables have transpositions or reversals.

2. Description of the Prior Art

In the subscriber loop portion of telecommunications systems, customer service is generally provided over electrical cables comprising many individually insulated conductors. These conductors are twisted together into pairs and a large number of the pairs are contained within a single protective sheath which includes a continuous metallic layer. The individual leads of the conductor pairs are designated the tip and ring wires. Each of the twisted pairs typically connects the customer premises to a switching point, usually a central office.

In providing a new connection between the customer and the switching point (or indeed between switching points), it is necessary to splice together a number of shorter cable lengths to establish the overall cable route. Also, in old installations, it oftentimes becomes necessary to replace one or more of the shorter cables or to divert or extend a cable route by splicing in a new cable section or path. In all these situations, to insure reliable completion of the splicing operation, testing for defective pairs is effectuated after the splicing activity.

During the splicing work, conductor pairs may be rendered defective in a number of ways. A conductor may be inadvertently broken or a conductor pair may be shorted or have a low resistance path created between the wires. These types of faults preclude using the pair because of the service-affecting nature of the fault. Fortuitously, however, these faults may be readily detected at a single location by suitable resistance or capacitance measuring devices long available in the art.

Particularly troublesome, though, are those faults that require a two-ended testing operation for reliable detection. For instance, in many applications, such as multiparty or TOUCH-TONE phone service, it is necessary to maintain proper tip-ring orientation throughout the entire cable route. Loss of tip-ring orientation results in a fault condition called a reversal. Since this fault results from mere criss-crossing of wires within a pair, it is virtually impossible to detect a reversal using a single-ended detection scheme. Of necessity, double-ended testing is prescribed, and the instant disclosure is directed towards the detection of reversals utilizing a method and apparatus simultaneously accessing both ends of the cable route undergoing troubleshooting.

Another fault that precludes single-ended diagnosis is the so-called transposition. Like the reversal, this fault involves the criss-crossing of wires, but in such a manner that both wires comprising one pair are interchanged with those of another pair. Again, conventional, single-location testing techniques are rendered virtually useless in troubleshooting a transposition. The instant disclosure is also directed towards the detection of transpositions.

A number of two-ended testing arrangements are known from prior art disclosures. They range: from the most rudimentary fault detecting techniques wherein a test signal is manually placed on one pair at a time and probing means are used to search through a bundle of pairs for the pair at another location; to the more sophisticated fault detection types wherein synchronized equipment sequences rapidly through a multitude of pairs while measuring for fault conditions.

U.S. Pat. No. 3,986,106, issued to E. E. Shuck et al on Oct. 12, 1976, is representative of the latter type arrangements. Shuck et al employ sets of precision, matched resistors to detect faults including reversals and transpositions. Control and slave sets, one at each end of the cable run, are automatically sequenced in fixed intervals. During the interval that a particular pair is addressed, a generator in the control set transmits a periodic pulse both onto the pair under test and through a corresponding path in the set. Detection circuitry compares: the pulse returned from the pair having a precision terminating resistor placed on the pair by the slave set; with the same pulse sent internally through the other correspondingly matched resistor. If the comparator determines the returned pulse magnitudes are equal, sequencing continues. Otherwise, a fault condition obtains and the number of the faulty pair is indicated via a display.

A number of shortcomings are inherent with techniques of this type. A major shortcoming is one that limits the maximum number of pairs that can be connected to the equipment at one time. To effectively determine faults, each cable pair is assigned a different resistance so that any short, open, misconnection, cross-connection and so forth will be detected by the difference in compared pulse amplitudes. However, as more pairs are connected to the apparatus, the gap between resistor values diminishes. Ultimately, normal cable parameters, such as leakage resistance, as well as parameter variations and noise considerations set an upper bound on the number of pairs that can be simultaneously connected. Another difficulty resides in the use of a periodically pulsed drive signal. It is probable, particularly when the splicing activity involves previously working pairs, that a ringer circuit on a bridged tap (a secondary cable path served by the primary route) may distort the return pulse and thereby falsely indicate a fault. Yet another limitation involves the use of matched, precision resistors in the harsh outside plant environment. In many applications, the control set may be located in the field whereas the slave set is housed in the central office. Any significant temperature disparity may generate testing errors.

U.S. Pat. No. 4,015,200, issued to M. T. Strandh on Mar. 29, 1977, also discloses a two-ended, sequential testing arrangement, but for the purpose of testing individual conductors rather than conductors grouped as pairs. The apparatus can only be used to detect an incorrect connection of individual wire pairs and cannot distinguish between pair transpositions and reversals.

U.S. Pat. No. 4,074,187, issued to D. H. Miller et al on Feb. 14, 1978, discloses two-ended testing equipment to detect, among other faults, transpositions and reversals on a multipair cable wherein each pair is individually shielded. The apparatus comprises a plurality of light-emitting diodes (six per pair) and switches to test for the various fault conditions. Two LEDs per pair are in the remote test unit, thereby requiring a craftsperson to be present at the remote location to interpret the display.

SUMMARY OF THE INVENTION

The prior art shortcomings, limitations and deficiencies are obviated in accordance with the present invention of an improved double-ended cable tester, and associated method, that detects and displays those pairs in a multipair cable having transpositions and reversals.

The tester comprises two units, one at each end of the cable run being checked, operating in synchronism to sequentially and automatically step through a plurality of pairs. The master unit, while sequencing through the pairs, communicates the pair address information to the remote unit so it may also sequence through corresponding pairs and provide predetermined terminal conditions. During a particular sequencing step, two modes of testing are alternately activated. In the first mode, a transposition is detected whenever a DC voltage, placed on all pairs but the pair under test by the remote set, is detected on the pair under test. The second mode tests for a reversal of the pair under test using resistance measurement circuitry after the remote set has provided a polarity sensitive, resistive termination.

One feature of the tester is its capability of rapidly checking large pair count color-coded cables wherein transpositions and reversals are most predominant; rapidity obtains because: (1) there is no inherent upper bound on the number of pairs that can be simultaneously connected to the tester; (2) the remote test set operates in a hands-off mode unattended by a second craftsperson; and (3) once a test sequence is initiated by a tester, the test set automatically sequences through a predetermined number of pairs, subsequently terminating the test.

BRIEF DESCRIPTION OF THE DRAWING

The organization and operation of this invention will be better understood from a consideration of the detailed description of one illustrative embodiment thereof, which follows, when taken in conjunction with the accompanying drawings:

FIG. 5 is a schematic diagram of the auxiliary cross-connect apparatus of FIG. 4.

DETAILED DESCRIPTION

Figure 1:
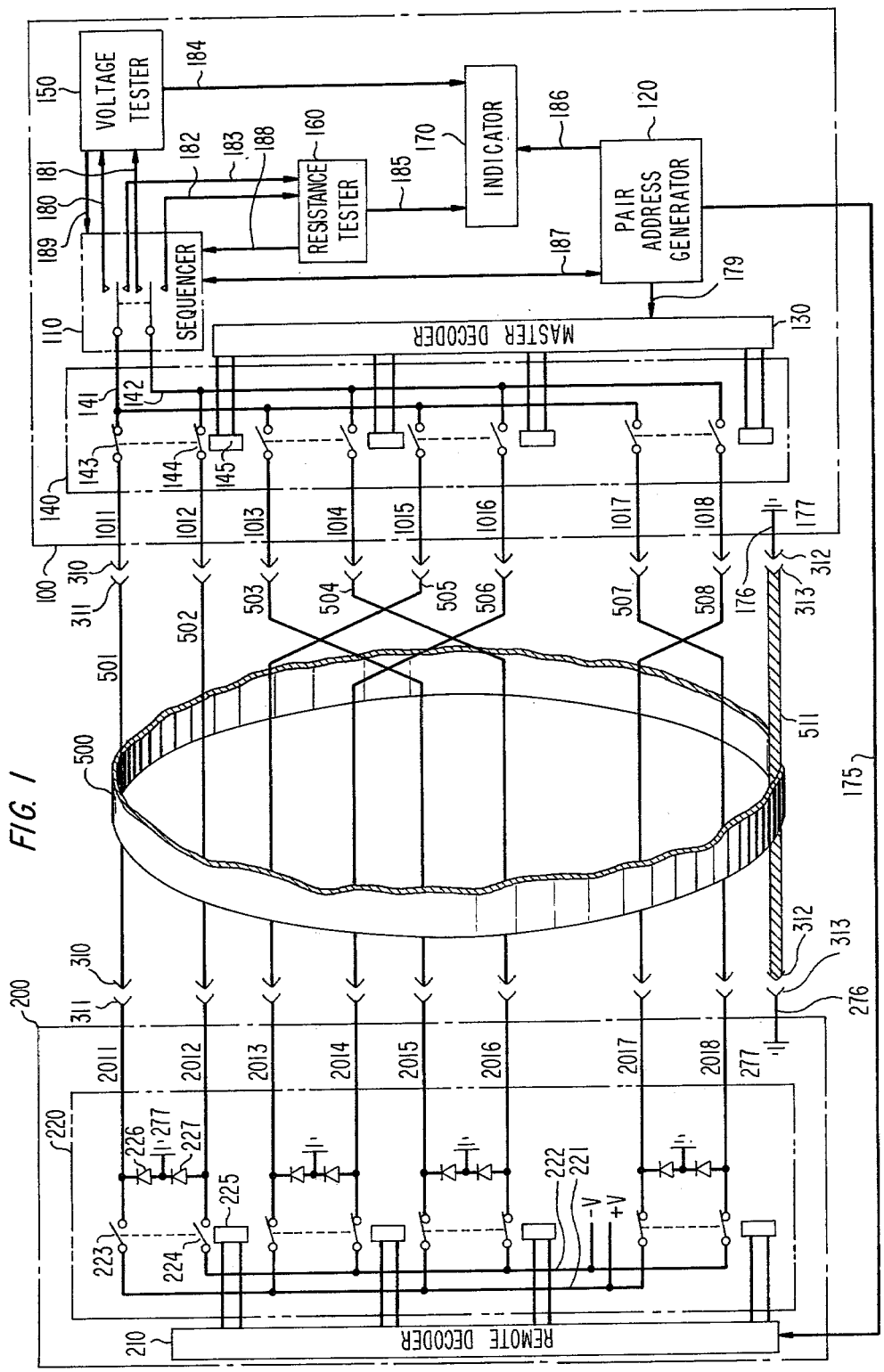
FIG. 1 is a diagram, in combined schematic, block diagram and pictorial form, depicting an illustrative embodiment of the cable test system in overview fashion wherein a good pair is prepared to undergo testing.

In elaborating on the particulars of the illustrative embodiment, it is helpful to visualize and discuss a layout of the complete system in an overview fashion. Accordingly, FIG. 1 depicts, in combined schematic, block diagram and pictorial form, two units, namely, master unit 100 and remote unit 200, comprising the basic tester, along with necessary connecting means to interface each unit to cable 500 under test. The 501,502 pair is a good pair prepared to undergo testing, as will be explained shortly. Pair 503,504 is transposed with pair 505,506, whereas pair 507,508 is reversed, and all are awaiting testing.

To enable units 100 and 200 to operate in synchronism, a set of leads, designated as control channel 175, serves as telemetry and runs between the master and remote units. Oftentimes control channel 175 is provided by pairs that either have not been affected by the work activity or are manually prechecked. Channel 175 provides pair address information to remote decoder 210 so that both master decoder 130 and remote decoder 210 can operate, respectively, access switch 140 and termination switch 220 in synchronism.

In order to provide an electrical reference point essentially common to both units 100 and 200, continuous metallic layer 511 comprising the sheath surrounding cable 500 is typically utilized. Lead 176 connects one end of layer 511 to unit 100, whereas lead 276 connects the other end of layer 511 to unit 200.

At the location of master unit 100, conductors 501, 502, ..., 508 are connected, respectively, to master unit leads 1011, 1012, ..., 1018 emanating from the unit, using interposed connectors 310 and correspondingly mated connectors 311. Similarly, pairs of connectors of the 310,311 type are used to join conductors 501, ..., 508 to leads 2011, ..., 2018 at the remote location in the proper sequence presuming no errors.

Testing commences whenever sequencer 110 is reset, under operator initiative, so that testing and sequencing may begin on the first pair 501,502. Sequencer 110 then triggers pair address counter 120 via lead 187 to initiate counting. Typically it is convenient to test cable pairs in bundles of twenty-five, the so-called subunit, so that the size of the subunit usually determines the upper bound on the limiting count value of counter 120. Thus, at the end of each testing interval for each pair, counter 120 increments in single steps until the limiting value is attained.

In master unit 100, the contents of pair address counter 120 are transmitted, usually in decimal coded form, on bus 179 and the contents are decoded in master decoder 130. For a given address, a corresponding one of access switches 145 operates to close normally open contact pair 143,144 and connects the pair under test to sequencer 110 via common buses 141 and 142. Switch 140, comprising access switches 145 with associated contacts 143 and 144 and buses 141 and 142, is depicted as a relay bank. However, switch 140, as well as switch 220 in remote unit 200, may also be, for example, a transistor or optoisolator switching arrangement. In the state shown by FIG. 1, decoder 130 has interpreted the output from counter 120 and, accordingly, has energized one switch 145 that connects pair 501,502 to buses 141,142 via leads 1011,1012. The same address information is transmitted via channel 175 to remote decoder 210 in remote unit 200. Decoder 210 translates the information arriving on channel 175 and operates all terminator switches 225 but the one associated with pair 501,502. With the switch contact pair 223,224 associated with pair 501,502 left open, positive and negative voltages present on leads 221 and 222, respectively, are not placed on pair 501,502, whereas these voltages are placed on all other pairs.

During the initial phase of the testing interval, sequencer 110 connects voltage tester 150 across the ends of the conductor pair under test via leads 180,181; in FIG. 1, this pair is pair 501,502. Voltage tester 150 measures the differential voltage level across the pair under test. Independent tip and ring voltages with respect to reference point 177 may also be measured. For voltage measurements less than a predetermined threshold, the pair is judged to be not transposed. If the measured voltage is above the threshold, the pair is considered transposed and indicator 170 is activated via lead 184 to display the address of the pair. Indicator 170 interfaces with counter 120 via lead 186 so pair address information is available for decoding and subsequent readout. Indicator 170 may be, for example, a digital display device.

In FIG. 1, pair 501,502 is not transposed, so testing continues; sequencer 110 now switches pair 501,502 to resistance tester 160 using leads 182,183. Resistance tester 160 is an ohmmeter-like device which places a negative voltage on lead 1012 via bus 142, and a positive voltage on lead 1011 via bus 141, and proceeds to measure the resistance between conductor pair 501,502 and common reference point 177. On a good pair, diode 226, having its cathode connected to lead 2011 and its anode to common point 277, and diode 227, having its anode connected to lead 2012 and its cathode to point 277, are both reverse biased. Thus, for a good pair, the overall resistance measured by tester 160 approaches the leakage resistance of the pair (in the order of megohms). However, for a pair reversal, diodes 226 and 227 are forward biased and a low resistance measurement obtains. Indicator 170 is signaled via lead 185 accordingly and the faulty pair number is displayed.

Figure 2:
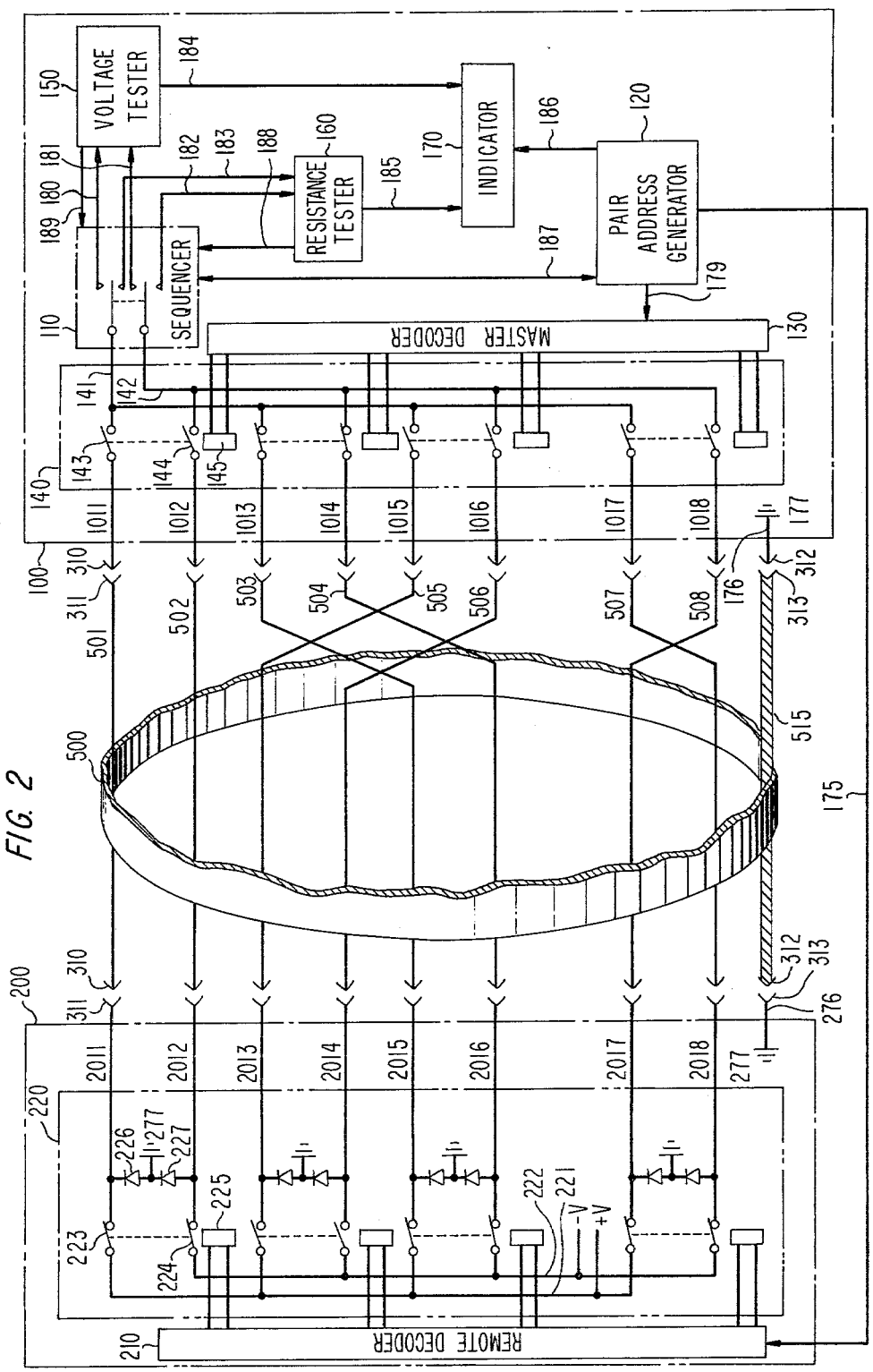
FIG. 2 is a diagram similar to FIG. 1 wherein a transposed pair is prepared to undergo testing.

To further exemplify the operation of the tester as suggested by the above discussion, FIG. 2 depicts sequencer 110 connected to pair 503,504, which is prepared for testing during the second test interval. Since pair 503,504 is transposed with pair 505,506, voltage tester 150 detects the voltage signals appearing on pair 503,504 via leads 2015,2016. The diodes 226,227 across leads 2015,2016 are reverse biased so the diodes do not affect the voltage measurement. Indicator 170 is signaled by voltage tester 150 to display a transposition of, in this instance, the second pair. Sequencer 110 is also signaled, via lead 189, to inhibit the check for reversal, and await the next testing interval. Of course, since the next pair 505,506 has an identical fault, a sequencing operation similar to the one just described for pair 505,506 obtains.

Figure 3:
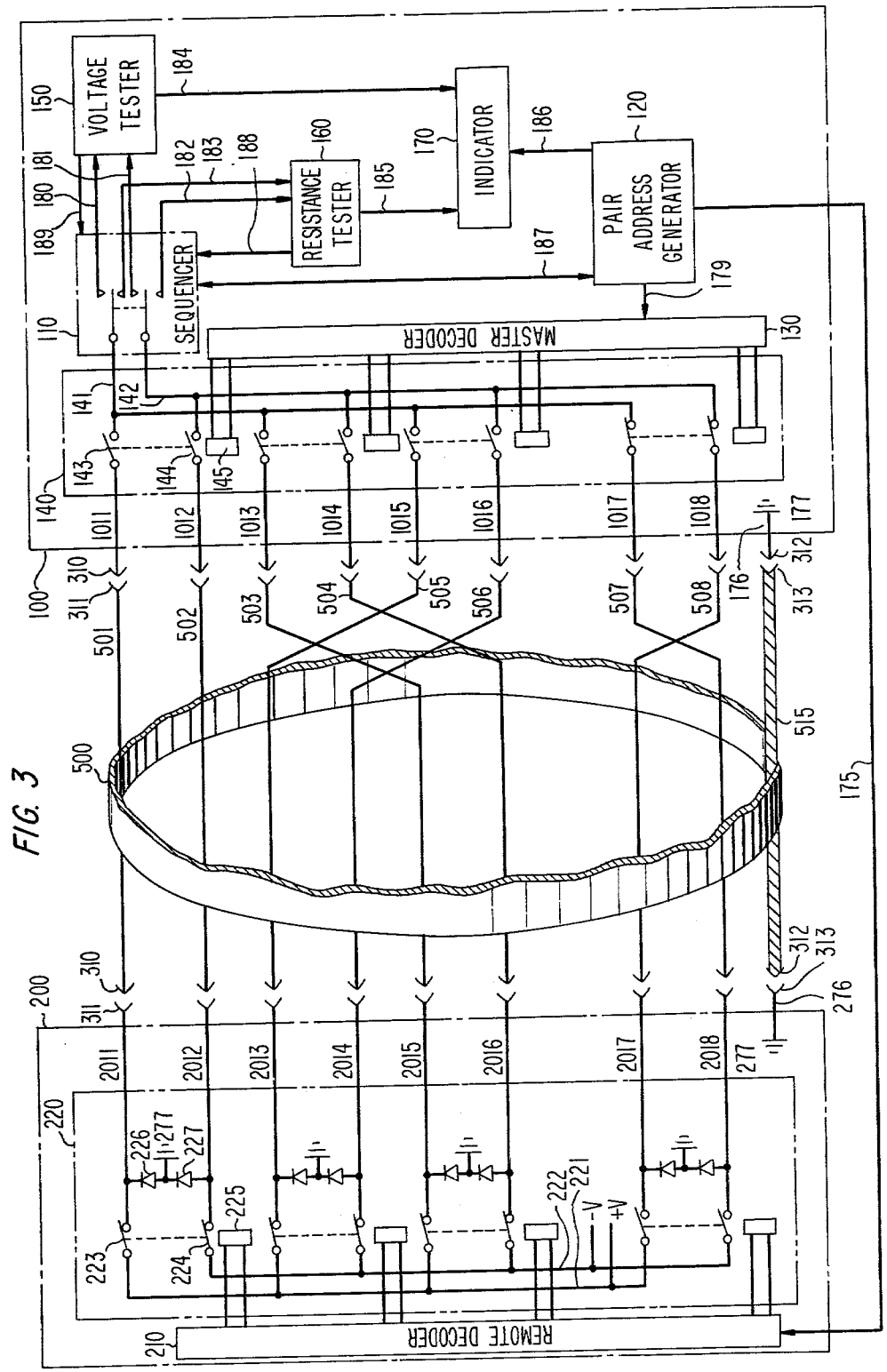
FIG. 3 is a diagram similar to FIG. 1 wherein a reversed pair is prepared to undergo testing.

The situation of a reversal is depicted in FIG. 3, wherein sequencer 110 is connected to pair 507,508 and testing is initialized. Voltage tester 150 does not detect the presence of voltage on the pair since pair 507,508 appears at the appropriate terminals on each end. During the resistance checking phase, however, diode pair 226,227 associated with leads 2017,2018 are forward biased to the voltages applied by resistance tester 160 and resistance tester 16 measures a low resistance. Accordingly, indicator 170 is signaled to display the pair number having the reversal. Moreover, sequencer 110 is signaled by resistance tester 160, via lead 188, to prepare for the next test interval. Testing proceeds in this manner until all pairs are tested, whereupon counter 120 deactivates sequencer 110, which awaits further initialization.

Figure 4:
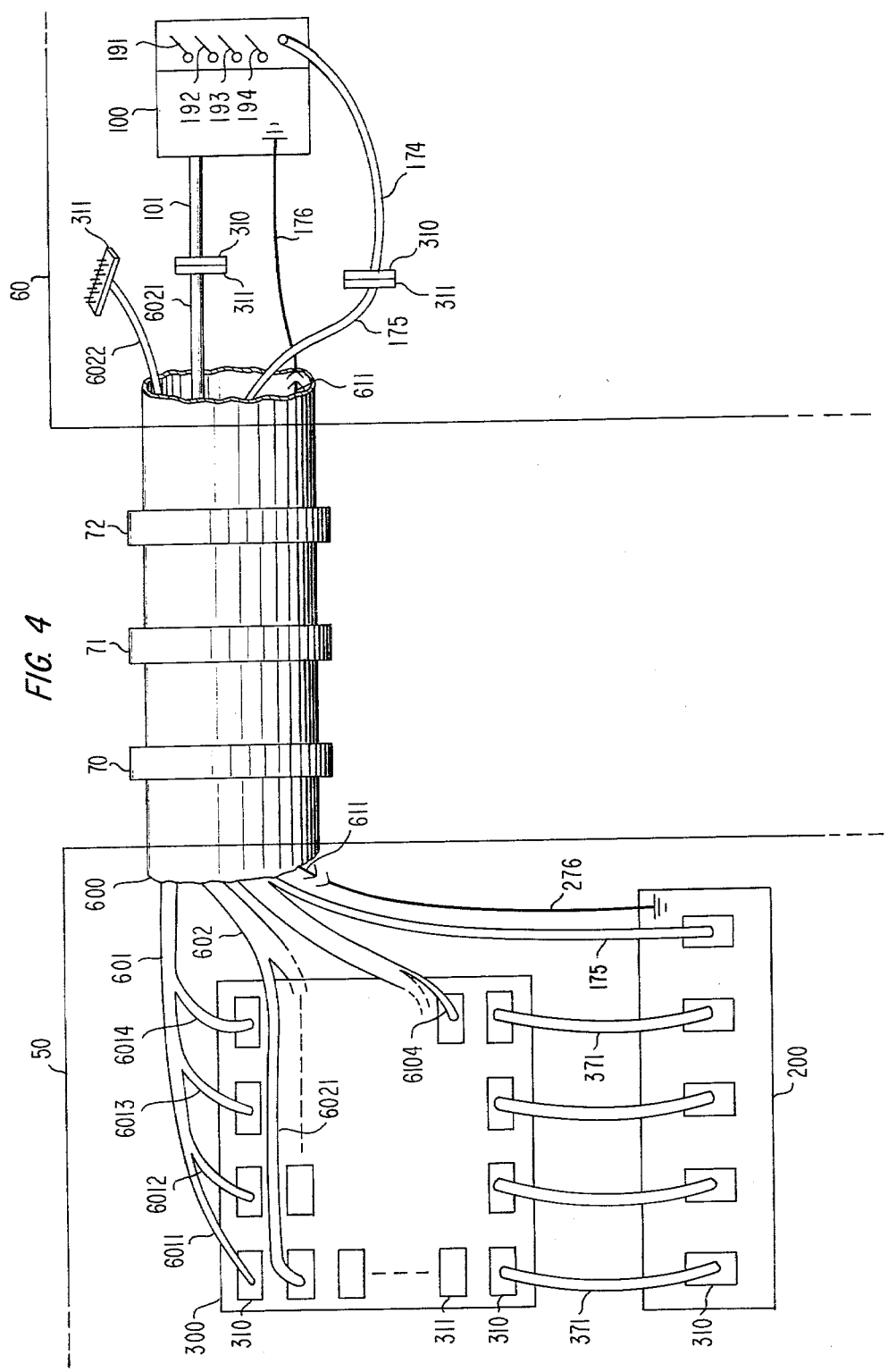
FIG. 4 is a diagram, in combined schematic, block diagram and pictorial form, showing auxiliary cross-connect apparatus added to the illustrative embodiment of FIG. 1.

In testing large pair count cable, it is helpful to provide interface apparatus which augments testing capability and adds connection flexibility to the basic testing arrangment. FIG. 4 depicts auxiliary cross-connect apparatus 300 used to accomplish these purposes. The test system of FIG. 4 shows cable 600 undergoing a sectionalized test wherein three splices 70, 71 and 72, in addition to the 310, 311 connection at 60, are being monitored for fault conditions. In addition, the typical arrangement of locating the remote unit 200 in central office 50 and the master unit 100 at the field site 60 is shown.

A multipair cable with a large number of pairs is usually partitioned into a number of so-called groups having 100 pairs each; each group comprises four 25-pair subunits. In FIG. 4, an exemplary 1000-pair cable includes: group 601 which comprises subunits 6011, 6012, 6013 and 6014; group 602 including subunits 6021 through 6024; and so forth until, lastly, group 610 comprises subunits 6101 through 6104. With the aid of apparatus 300, the test system enables the detection of not only tip-ring reversals and pair transpositions but also transpositions between subunits, as will be described shortly.

Figure 5:
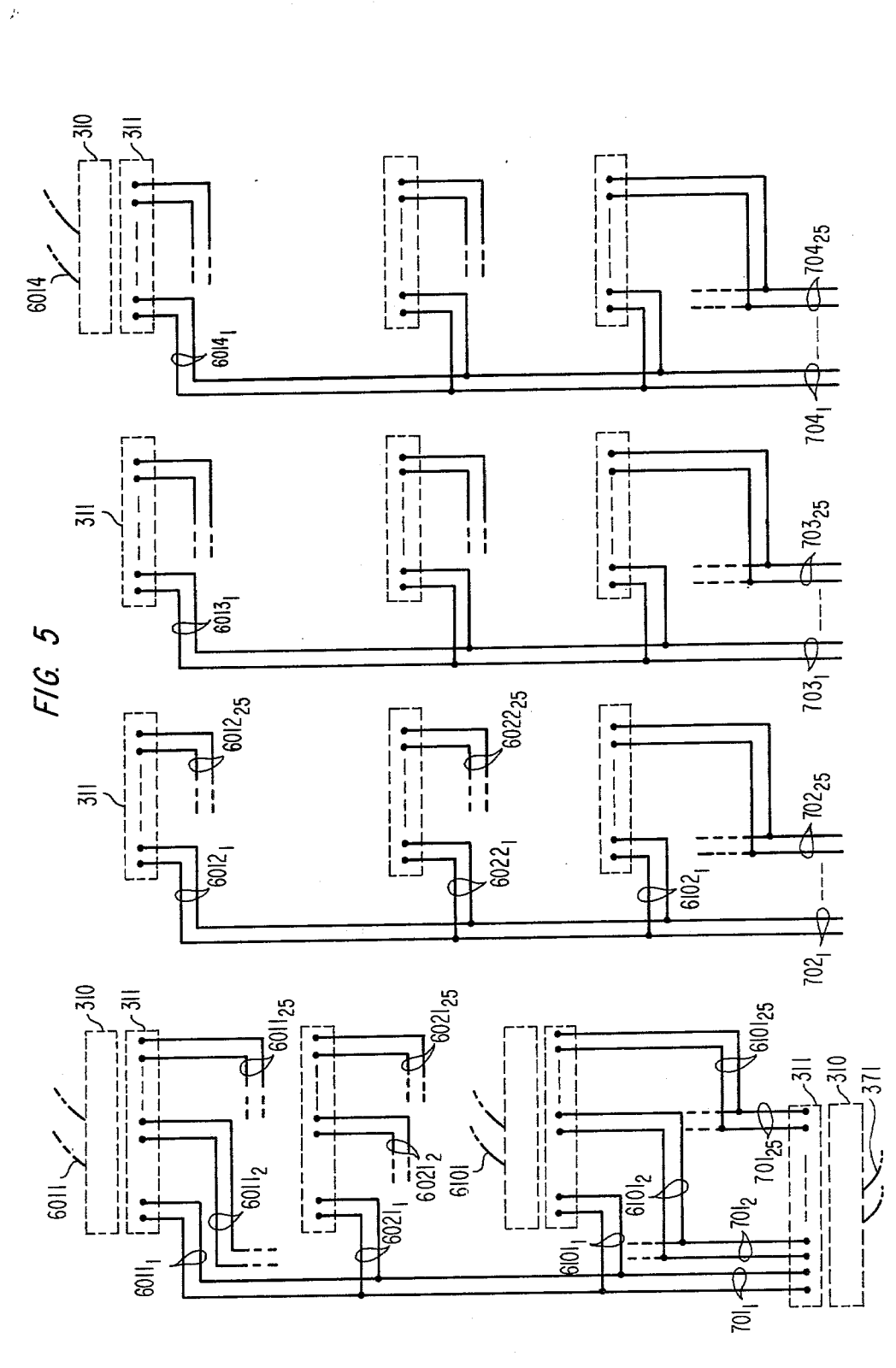
Figure 6:
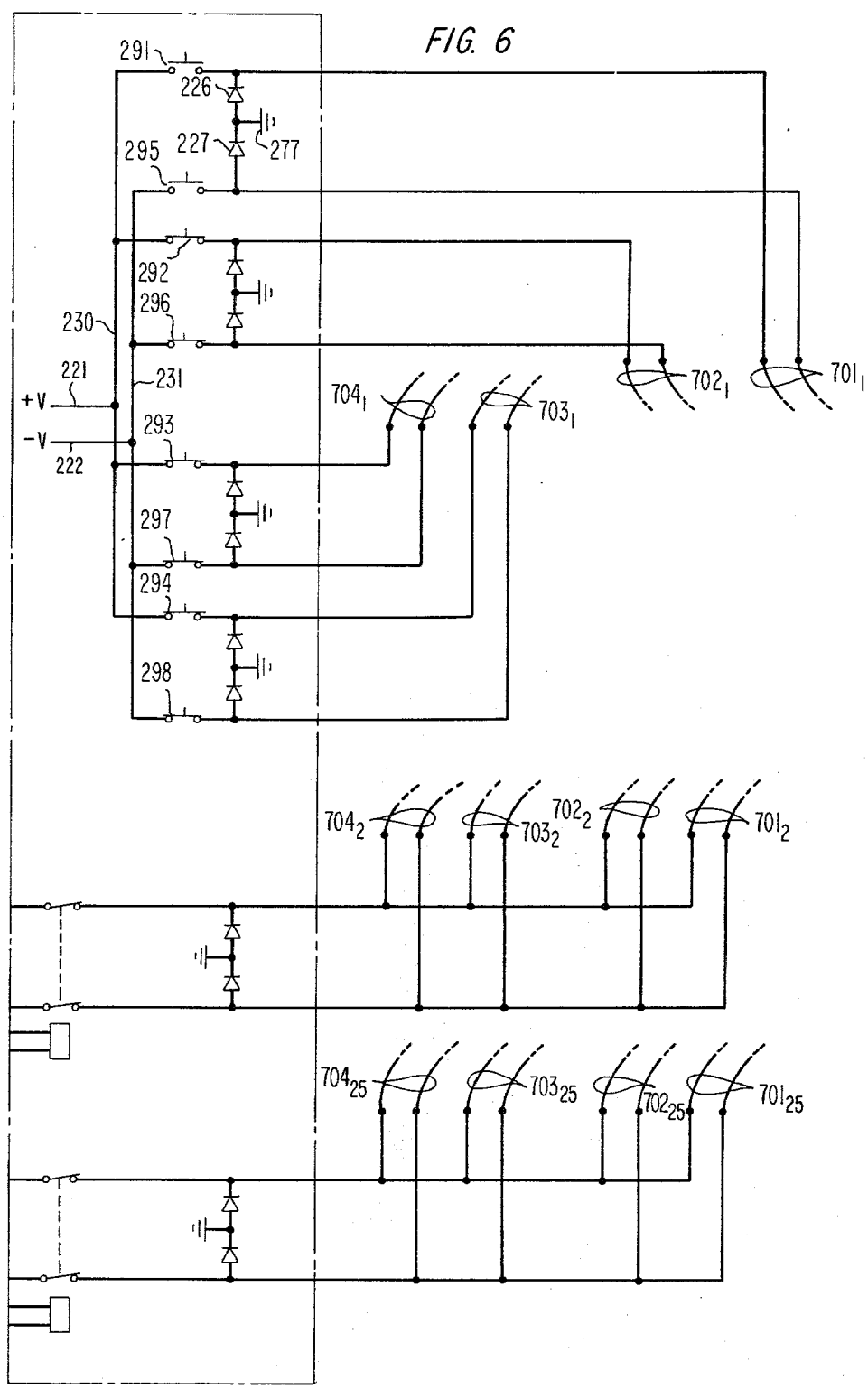
FIG. 6 is a schematic diagram depicting a modification made to the illustrative embodiment of FIG. 1 to detect subunit transpositions.

Each subunit at location 50 may be conveniently terminated in connector 310, which plugs into a correspondingly mated connector 311 in cross-connect apparatus 300. Test unit 200 is connected to apparatus 300 using four identical 25-wire pair harnesses 371. Each end of these harnesses is also terminated in a connector 310. The ends of harnesses 371 that terminate on apparatus 300 plug into a row of connectors 311 located as an additional row below the matrix of cable connectors. Each of the four columns of connectors 311 attaching cable 600 (for example, column one comprises connectors having subunits 6011,6021, . . . , 6101 attached) are jumpered, pin-for-pin, to the corresponding harness connector 311 in that column. This arrangement is shown in FIG. 5. Pair one from subunit 6011, designated 6011₁, pair one from subunit 6021 (6021₁,) and so forth, are jumpered tips-to-tips and rings-to-rings to pair one of common subunit 701 designated 701₁. Subunit 701, pair one through twenty-five, is terminated in the leftmost connector 311. An identical arrangement exists for all other cable subunits. Internally, remote unit 200 jumpers corresponding pairs of the various common subunits, except pair one from each subunit. This is depicted in FIG. 6. The benefit of such an arrangement will become apparent. It is also readily apparent from the above description that any particular pair group may be directly connected to remote set 200 without the aid of or need for auxiliary apparatus 300 or harnesses 371.

Referring again to FIG. 4, to enable units 100 and 200 to operate in synchronism, a set of conductors, designated as control channel 175, runs between locations 50 and 60.

In order to provide an electrical reference point essentially common to both units 100 and 200, continuous metallic path 611 comprising a portion of the sheath surrounding cable 600 is utilized; lead 276 connects metallic layer 611 to unit 200.

At location 60, master unit 100 is similarly connected to metallic path 611 with lead 176. Also, the conductors used for synchronizing and control emanate from unit 100 via control cable 174, which has connector 310 on one end to mate with a connector 311 terminating channel 175 appearing at location 60. Master unit 100 is preferably adapted to test one subunit at a time. Access for testing is provided by 25-pair cable 101, terminated in connector 310 to receive connectors 311 attached to the subunit ends appearing at location 60. In FIG. 4, subunit 6021 is shown connected for testing, whereas subunit 6022 is shown awaiting testing.

The conductors that comprise cable 174 transmit telemetry which includes: "units" information about the pair under test; "tens" information about the pair under test; and data that transmits to remote set 200 the identity of one of four subunits in any particular group undergoing test. The latter information is manually selected by the operator of master unit 100 using ON-OFF switches 191 through 194 accessible to the operator. Also, "Power-ON" data and timing data are supplied to the remote set 200 by cable 174.

Because subunit identity information is available to remote set 200, it is now possible to detect subunit transpositions. FIG. 6 depicts the modifications made to remote decoder 220 to accommodate detection of subunit transpositions. With reference to FIG. 6, a positive DC voltage and a negative DC voltage are tied to common interface buses 230 and 231, respectively. Each of the automatically operated ON-OFF switches 291 through 294 is in series with bus 230 and the tip of the first pair in the corresponding subunit. For instance, switch 291 is in series with the tip lead of the first pair in the first common subunit, that is, pair 701; switch 292 is associated with the tip of the first pair in the second subunit, 702, and so forth. Similarly, bus 231 connects each of the switches 295 through 298 to the corresponding rings of the first pair in the common subunits. Switch 291 operates in unison with 295, 292 with 296, 293 with 297, and 294 with 298.

The signal to open each of normally closed switches 291 through 294, and their ring counterparts 295 through 298, results from an AND operation combining the pair address information relating to pair number one with subunit enable information provided by switches 191 through 194. For example, contact pair 291,295 is open whenever the pair address counter registers the first count and switch 191 is closed. For all other input combinations, pair 291,295 is closed. Similarly, pair 292,296 opens in response to switch 192 being closed and the pair address counter registering the first count.

To illustrate the detection technique for subunit transpositions, subunit 6012 of FIG. 4 is considered to be transposed, say at splice 71, with subunit 6011. The operator wishes to test subunit 6011 and therefore closes switch 191. Referring to FIG. 6, switches 291 and 295 are opened during the pair one test period in response to switch 191 closing. Since subunit 6011 appears in 702, due to the transposition, voltage is detected on the first pair through closed switch pair 292,296, and a transposition is displayed by indicator 170. However, for all the remaining 24 pairs, no transposition will be indicated. Thus, whenever there is solely a subunit transposition, the first pair in a subunit is the only one detected as being transposed. Although this example utilized cross-connect apparatus 300, the subunit detection capability applies as well when testing only a 100-pair group comprising four subunits. Apparatus 300 extends automated testing capability to more than just a single group.

Whereas units 100 and 200, as well as auxiliary apparatus 300, have been described as testing solely for transpositions or reversals, it is anticipated that the tester will generally be part of a composite test system that accomplishes other testing functions as well, such as single-ended tests for opens, shorts, and so forth. To insure correct diagnosis of reversals and transpositions, two-ended tests usually follow single-ended tests. On the other hand, the tester may also be used to facilitate detection of some faults that may generally prove difficult to detect with single-ended tests. For example, a split (a criss-crossing of one wire from one pair with a single wire from another pair) is usually detected with a capacitance unbalance measurement. However, a split near the far end is not usually detectable. With this tester, using a voltage-to-ground measurement arrangement, the split is easily detected and registers as a transposition.

Finally, with regard to the multiple fault of a reversal together with a transposition, this type of fault yields a voltage during the voltage measurement interval that is reversed in phase. A diagnostic heirarchy would indicate a transposition first and, after that is cleared, the reversal. However, a polarity sensitive voltage tester 150 could be incorporated, with appropriate display, to indicate this double fault condition in a single step.

It is to be further understood that the multipair cable tester, and associated methodology, described herein is not limited to the specific forms disclosed by way of example and illustration, but may assume other embodiments limited only by the scope of the appended claims.

I claim:

1. Multipair wire testing apparatus for determining if a pair under test, identified by a preselected address, has a transposition between first and second test locations characterized by
    means at said first location comprising:
    voltage measurement means including indicator means;
    means for connecting said pair under test to said voltage measurement means; and
    means for communicating said preselected address to said second location;
    means at said second location comprising:
    a voltage source;
    means for terminating said multipairs on terminal pairs having predetermined addresses; and
    means, responsive to said communicating means, for connecting said voltage source across all said terminal pairs except for said terminals having said preselected address;
    wherein said indicator means signals said pair under test as being transposed whenever said voltage means measures a voltage above a predetermined threshold.

2. The apparatus as recited in claim 1 wherein said means at said first location further comprises means for sequencing said apparatus, in discrete intervals, to automatically test all pairs having said predetermined addresses for transpositions.

3. The apparatus as recited in claim 2 for checking said pair under test for a reversal whenever it is not transposed wherein
    said means at said first location further comprises resistance measurement means including a polarized source;
    said connecting means includes first and second modes to connect said pair under test, in said first mode, to said voltage means to check for said transposition and, alternately, in said second mode, to said resistance measurement means to apply said polarized source to test for said reversal; and
    said means at said second location further comprises polarity-sensitive resistive means connected across each of said terminal pairs, oriented to provide high resistance to said voltage source and arranged to provide low resistance to said polarized source for a reversal;
    wherein said indicator means is responsive to said resistance means to signal, during said second testing mode, that said pair under test is reversed whenever said resistance means measures a resistance below a predetermined level.

4. The apparatus as recited in claim 3 wherein said voltage source is a direct current source,
said polarized source is a direct current source,
said polarity-sensitive resistance is a diode,
said voltage measurement means is a voltmeter, and
said resistance measurement means is an ohmmeter.

5. Multipair wire testing apparatus for determining at a first location if a pair under test, identified by a preselected address, is reversed or transposed with another pair at a second location
characterized by
a low resistance path between said first and second locations;
means at said first location comprising:
voltage measurement means having one terminal connected to said path;
resistance measurement means, including a polarized source, having one terminal connected to said path;
indicator means responsive to both said voltage measurement means and said resistance measurement means;
means, having first and second modes, for connecting, in said first mode, a preselected wire from said pair under test to said voltage measurement means and, in said second mode, the complementary wire from said pair under test to said resistance measurement means; and
means for communicating said preselected address to said second location, means at said second location comprising:
a voltage source;
means for terminating a preselected wire from each of said multipairs on terminals having preselected addresses;
means, responsive to said communicating means, for connecting said voltage source between each of said terminals, except for the one of said terminals associated with said preselected address, and said low resistance path;
polarity-sensitive resistive means, connected from each of said terminals to said low resistance path, and oriented to provide high resistance to said voltage source and arranged to provide low resistance between said complementary wire and said path for a reversal; and
wherein said indicator means, in said first mode, signals said pair under test as being transposed whenever said voltage means registers a voltage above a predetermined threshold and, in said second mode, signals said pair under test as being reversed whenever said resistance measurement means registers a resistance below a predetermined level.

6. The apparatus as recited in claim 1 for testing a cable partitioned into subunits to determine subunit transpositions wherein
said means for communicating further includes means for transmitting the identity of the subunit containing said pair under test, and
said means at said second location further comprises:
connection apparatus, interposed between said cable and said terminating means, including
means for interconnecting corresponding pairs of said subunits, except for a correspondingly predetermined pair from each of said subunits, to said terminal pairs; and interface apparatus, controlled by said transmitting means and said preselected address, for connecting to a correspondingly predetermined one of said terminal pairs said predetermined pair from each of said subunits, except for said predetermined pair from said identified subunit whenever said preselected address corresponds to the address of said predetermined pair.

7. The apparatus as recited in claim 6, wherein a predefined number of said subunits are arranged to form a group, further comprising cross-connect apparatus, interposed between said cable and said connection apparatus, including means for interconnecting corresponding ones of said subunits from each said group to form common subunits for connecting to said connecting apparatus.

8. A method for determining at a first test location if a pair under test, identified by a preselected address, is transposed with any of a number of pairs at a second location,
characterized by the steps of
communicating to said second location said preselected address;
applying, at said second location, a voltage to said pairs having predetermined addresses except for the pair having said preselected address,
measuring the voltage present on said pair under test at said first location, and
indicating said pair under test as being transposed whenever said voltage present is above a predetermined threshold.

9. A method for detecting transpositions of conductor pairs in a multiconductor cable
characterized by the steps of
synchronously removing a direct current voltage from said one end of each of said pairs while connecting the other end of the same pair to a voltmeter, and
identifying transposed connected conductor pairs having a direct current voltage thereon.

* * * * *